United States Patent
Gunji

(10) Patent No.: US 10,879,492 B2
(45) Date of Patent: Dec. 29, 2020

(54) DISPLAY DEVICE AND MANUFACTURING METHOD THEREOF

(71) Applicant: Japan Display Inc., Minato-ku (JP)

(72) Inventor: Masakazu Gunji, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 75 days.

(21) Appl. No.: 15/924,452

(22) Filed: Mar. 19, 2018

(65) Prior Publication Data

US 2018/0277794 A1  Sep. 27, 2018

(30) Foreign Application Priority Data

Mar. 22, 2017 (JP) ................. 2017-055911

(51) Int. Cl.
*H01L 51/52* (2006.01)
*H01L 27/32* (2006.01)
*H01L 51/56* (2006.01)

(52) U.S. Cl.
CPC ...... *H01L 51/5265* (2013.01); *H01L 27/3244* (2013.01); *H01L 51/5218* (2013.01); *H01L 51/5234* (2013.01); *H01L 51/5253* (2013.01); *H01L 51/56* (2013.01); *H01L 2224/29123* (2013.01); *H01L 2251/305* (2013.01); *H01L 2251/5315* (2013.01)

(58) Field of Classification Search
CPC ........... H01L 21/2855; H01L 21/02631; H01L 51/0008; H01L 27/3244–3279; H01L 27/3274

See application file for complete search history.

(56) References Cited

U.S. PATENT DOCUMENTS

| | | | | |
|---|---|---|---|---|
| 6,121,727 A * | 9/2000 | Kanai | ................. | H01L 51/5092 313/504 |
| 6,310,231 B1 * | 10/2001 | Igarashi | ................ | C07F 7/0814 556/489 |
| 6,929,871 B2 * | 8/2005 | Arakane | ................ | C09K 11/06 313/504 |
| 7,449,831 B2 * | 11/2008 | Aziz | ................... | H01L 51/5088 313/504 |
| 9,362,517 B2 * | 6/2016 | Ohsawa | .............. | H01L 51/5016 |
| 9,412,793 B2 * | 8/2016 | Seo | ...................... | H01L 51/5265 |

(Continued)

FOREIGN PATENT DOCUMENTS

JP  2003-217829  7/2003

*Primary Examiner* — Mary A Wilczewski
*Assistant Examiner* — Tsz K Chiu
(74) *Attorney, Agent, or Firm* — Oblon, McClelland, Maier & Neustadt, L.L.P.

(57) ABSTRACT

A display device according to an embodiment of the present invention includes: an electrode; a light-emitting layer formed on the electrode; and a metal-containing film formed on the light-emitting layer and containing a first metallic element. The metal-containing film includes a metal layer forming an interface of the metal-containing film on the side of the light-emitting layer, formed of a simple substance of the first metallic element or an alloy of the first metallic element and a second metallic element, and a light-transmitting oxide layer forming an interface of the metal-containing film on the opposite side from the interface on the side of the light-emitting layer, formed of an oxide of the first metallic element, and having a light-transmitting property.

11 Claims, 13 Drawing Sheets

(56) References Cited

U.S. PATENT DOCUMENTS

| | | | | |
|---|---|---|---|---|
| 9,548,468 B2* | 1/2017 | Seo | ................ | H01L 51/5237 |
| 10,170,710 B2* | 1/2019 | Yamada | ................ | C23C 16/42 |
| 10,270,039 B2* | 4/2019 | Seo | ................ | H01L 51/5004 |
| 2002/0024096 A1* | 2/2002 | Yamazaki | ............ | H01L 51/524 |
| | | | | 257/359 |
| 2002/0051894 A1* | 5/2002 | Yoshikawa | ........... | C07D 271/10 |
| | | | | 428/690 |
| 2003/0117071 A1* | 6/2003 | Lee | ................ | H01L 51/5221 |
| | | | | 313/512 |
| 2003/0234609 A1* | 12/2003 | Aziz | ................ | H01L 51/5281 |
| | | | | 313/504 |
| 2004/0061118 A1* | 4/2004 | Yamazaki | ........... | H01L 51/5253 |
| | | | | 257/79 |
| 2005/0140283 A1* | 6/2005 | Lau | ................ | H01L 27/1266 |
| | | | | 313/506 |
| 2011/0031877 A1* | 2/2011 | Takada | ................ | C09K 11/06 |
| | | | | 313/504 |
| 2011/0210323 A1* | 9/2011 | Imai | ................ | H01L 51/0072 |
| | | | | 257/40 |
| 2012/0119199 A1* | 5/2012 | Okamoto | ........... | H01L 51/5234 |
| | | | | 257/40 |
| 2015/0380608 A1* | 12/2015 | Lowenthal | ............ | H01L 33/38 |
| | | | | 257/13 |
| 2017/0271609 A1* | 9/2017 | Imai | ................ | C07D 519/00 |
| 2018/0151630 A1* | 5/2018 | Yamaoka | ............ | H01L 51/504 |

* cited by examiner

STEP 1

DISPLAY DEVICE AND MANUFACTURING METHOD THEREOF

CROSS-REFERENCE TO RELATED APPLICATION

The present application claims priority from Japanese Application JP2017-55911 filed on Mar. 22, 2017, the content of which is hereby incorporated by reference into this application.

BACKGROUND OF THE INVENTION

1. Field of the Invention

The present invention relates to a display device and a manufacturing method thereof.

2. Description of the Related Art

In a display device including an organic electroluminescence (EL) element of a top emission type, a metal thin film having a light-transmitting property may be provided as an electrode on a light-emitting layer. The electrode made of the metal thin film functions as a half-mirror when optical interference is used for the purpose of improving the luminous efficiency or color purity of the light-emitting layer.

SUMMARY OF THE INVENTION

However, the electrode made of the metal thin film is formed to be as thin as approximately 5 to 30 nm in view of ensuring transmittance, and therefore has a poor barrier property against water, oxygen, or the like. For this reason, water, oxygen, or the like damages the electrode or permeates through the electrode to damage the light-emitting layer, which may impair the durability of the organic EL element.

JP 2003-217829 A discloses an organic EL element covered with a moisture-absorbing layer made of magnesium oxide. However, this organic EL element is of a bottom emission type, in which a second electrode layer formed on an organic EL layer does not transmit light, but is formed to be thick for reflecting light. Therefore, the problem described in this application does not occur.

One or more embodiments of the present invention has been made in view of the problem described above, and an object thereof is to provide a display device capable of achieving the protection of a light-emitting layer and an electrode, and a manufacturing method thereof.

A display device according to an embodiment of the present invention includes: an electrode; a light-emitting layer formed on the electrode; and a metal-containing film formed on the light-emitting layer and containing a first metallic element. The metal-containing film includes a conductive metal layer forming an interface of the metal-containing film on the side of the light-emitting layer, formed of a simple substance of the first metallic element or an alloy of the first metallic element and a second metallic element, and having conductivity, and a light-transmitting oxide layer forming an interface of the metal-containing film on the opposite side from the interface on the side of the light-emitting layer, formed of an oxide of the first metallic element, and having a light-transmitting property.

A display device according to another embodiment of the present invention includes: an electrode; a light-emitting layer formed on the electrode; and a Mg-containing film formed on the light-emitting layer and containing magnesium (Mg). The Mg-containing film includes a conductive metal layer forming an interface of the Mg-containing film on the side of the light-emitting layer and formed of a magnesium-silver alloy (MgAg), and a light-transmitting oxide layer forming an interface of the Mg-containing film on the opposite side from the interface on the side of the light-emitting layer and formed of magnesium oxide (MgO).

A manufacturing method of a display device according to an embodiment of the present invention includes: forming, on a light-emitting layer, a metal-containing film containing a first metallic element, the metal-containing film including a conductive metal layer forming an interface of the metal-containing film on the side of the light-emitting layer, formed of a simple substance of the first metallic element or an alloy of the first metallic element and a second metallic element, and having conductivity, and a metal simple-substance layer forming an interface of the metal-containing film on the opposite side from the interface on the side of the light-emitting layer and formed of the first metallic element simple-substance; and oxidizing the metal simple-substance layer exposed at the interface of the metal-containing film on the opposite side.

A manufacturing method of a display device according to another embodiment of the present invention includes: forming, on a light-emitting layer, a Mg-containing film containing magnesium (Mg), the Mg-containing film including a conductive metal layer forming an interface of the Mg-containing film on the side of the light-emitting layer and formed of a magnesium-silver alloy (MgAg), and a Mg simple-substance layer forming an interface of the Mg-containing film on the opposite side from the interface on the side of the light-emitting layer and formed of magnesium (Mg); and oxidizing the interface of the Mg-containing film on the opposite side.

DETAILED DESCRIPTION OF THE INVENTION

Figure 1:
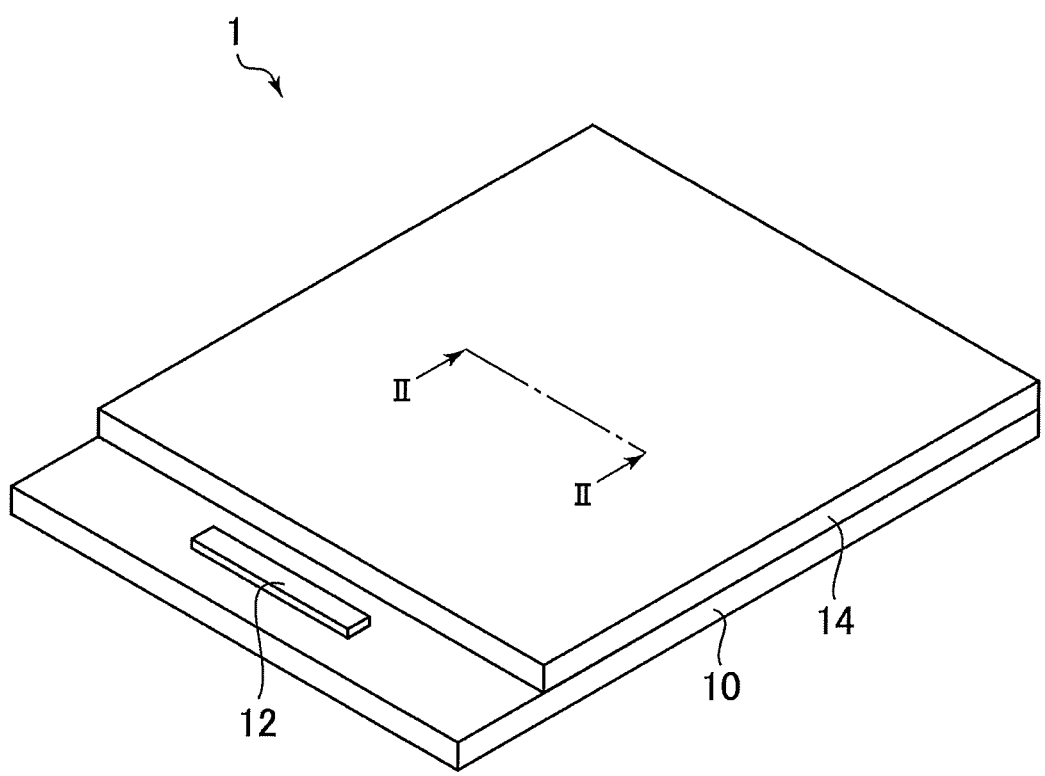
FIG. 1 is a perspective view of a display device according to an embodiment of the invention.

Hereinafter, each embodiment of the invention will be described with reference to the drawings. The disclosure is illustrative only. Appropriate modifications that will readily occur to those skilled in the art and fall within the spirit of the invention are of course included in the scope of the invention. In the drawings, the width, thickness, shape, and the like of each part may be schematically represented, compared to those in embodiments, for more clarity of description. However, they are illustrative only, and do not limit the interpretation of the invention. Moreover, in the specification and the drawings, elements similar to those described in relation to a previous drawing are denoted by the same reference numerals and signs, and a detailed description may be appropriately omitted.

Further, in the detailed description of the invention, the terms "on" and "below" as used in defining the positional relationship between one component and another component include, not only the case where one component is located directly on or directly below another component, but also the case where still another component intervenes between the components unless otherwise noted.

FIG. 1 is a perspective view of a display device 1 according to an embodiment of the invention. As an example of the display device, an organic EL display device is mentioned. The display device 1 is configured such that a full-color pixel is formed by combining unit pixels (sub-pixels) of multiple colors including, for example, red, green, and blue to thereby display a full-color image. The display device 1 includes a first substrate 10. The first substrate 10 is a stacked body in which an insulating film and a conductor layer are stacked on a transparent substrate made of, for example, glass or resin having flexibility such as polyimide. An integrated circuit chip 12 for driving elements to display an image is mounted on the first substrate 10, and a flexible printed board (not shown) may be connected thereto for external electrical connection. A second substrate 14 is attached to the first substrate 10. The second substrate 14 may include a touch panel substrate, or may function also as a cover glass.

Figure 2:
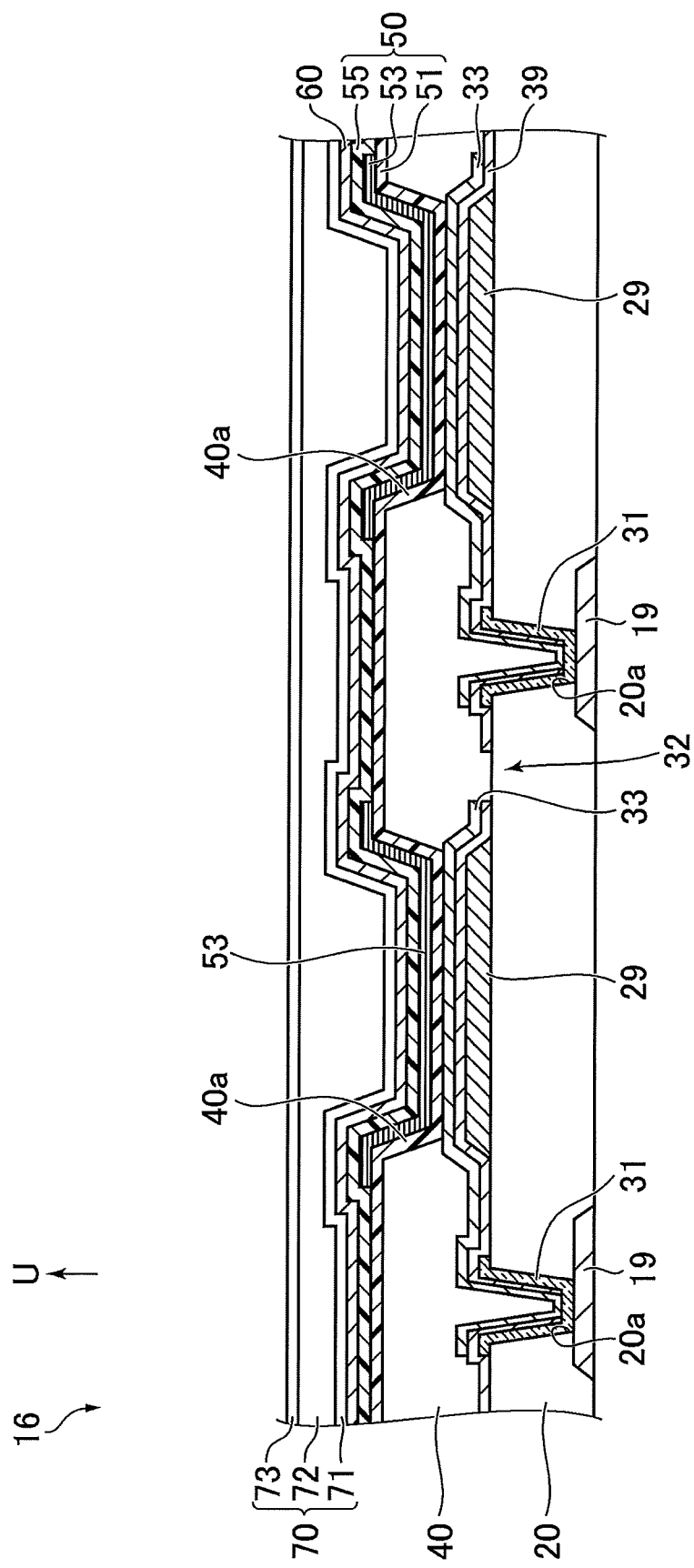
FIG. 2 is an enlarged cross-sectional view of the display device shown in FIG. 1, taken along line II-II.

FIG. 2 is an enlarged cross-sectional view of the display device shown in FIG. 1, taken along line II-II. FIG. 2 shows in an enlarged manner an element layer 16 of the first substrate 10 that is provided with organic EL elements. The element layer 16 is formed on a circuit layer including a thin film transistor, a wiring, and an insulating layer (all not shown). In FIG. 2, a planarization film 20, a bank 40, and a sealing film 70 are not hatched in order to facilitate viewing of a cross-sectional structure. In the following description, the stacking direction and the light extraction direction (the direction of the arrow U in FIG. 2) are defined as the upper direction.

A plurality of wirings 19 are formed in the lower portion of the element layer 16. The wirings 19 are respectively connected to thin film transistors (not shown) provided so as to respectively correspond to a plurality of unit pixels. The wiring 19 is formed of a conductive material containing, for example, aluminum (Al), silver (Ag), copper (Cu), nickel (Ni), titanium (Ti), molybdenum (Mo), or the like. In the embodiment, the wiring 19 has a three-layer stacked structure of Ti, Al, and Ti.

The wirings 19 are covered by the planarization film 20. The planarization film 20 is formed of an organic insulating material such as, for example, acrylic resin, and includes a flat upper surface. Contact holes 20a respectively corresponding to the plurality of wirings 19 are formed in the planarization film 20. A hole-filling conductor 31 made of a conductive material is formed inside the contact hole 20a, and is connected to the wiring 19. The hole-filling conductor 31 is formed of a transparent conductive material such as, for example, indium tin oxide (ITO), indium zinc oxide (IZO), or zinc oxide (ZnO).

A plurality of capacitance forming electrodes 29 are formed on the planarization film 20 so as to respectively correspond to the plurality of unit pixels. The capacitance forming electrode 29 is formed of a conductive material containing, for example, Al, Ag, Cu, Ni, Ti, Mo, or the like. In the embodiment, the capacitance forming electrode 29 has a three-layer stacked structure of Mo, Al, and Mo. One of the purposes of the hole-filling conductor 31 is to protect the wiring 19 from a patterning step in forming the capacitance forming electrode 29, but the hole-filling conductor 31 may be omitted.

The planarization film 20, the capacitance forming electrode 29, and the hole-filling conductor 31 are covered by an inter-layer insulating film 39. The inter-layer insulating film 39 is formed of an inorganic insulating material such as, for example, silicon oxide ($SiO_2$), silicon nitride (SiN), or silicon oxynitride (SiON). Openings corresponding to the contact holes 20a of the planarization film 20 are formed in the inter-layer insulating film 39. The hole-filling conductor 31 is exposed at the bottom of the opening.

A plurality of pixel electrodes 33 (e.g., anodes) are formed on the inter-layer insulating film 39 so as to respectively correspond to the plurality of unit pixels. The pixel electrode 33 is formed as a reflective electrode. The pixel electrode 33 is formed of a conductive material containing, for example, Al, Ag, Cu, Ni, Ti, Mo, or the like. In the embodiment, the pixel electrode 33 has a three-layer stacked structure of a transparent conductive layer, a metal layer, and a transparent conductive layer (e.g., ITO, Ag, and ITO). The metal layer contains, for example, at least one selected from Al, Ag, and Ti. The transparent conductive layer contains, for example, at least one selected from ITO, IZO, and ZnO.

The pixel electrode 33 is formed so as to overlap the capacitance forming electrode 29 in a plan view. The pixel electrode 33 and the capacitance forming electrode 29 interpose the inter-layer insulating film 39 therebetween, so that a capacitive element is formed. Moreover, the pixel electrode 33 is connected to the hole-filling conductor 31 through the opening of the inter-layer insulating film 39, and thus is electrically connected to the thin film transistor (not shown) through the wiring 19. Also inside the contact hole 20a, the pixel electrode 33 and the hole-filling conductor 31 interpose the inter-layer insulating film 39 therebetween, so that a capacitive element is formed.

The inter-layer insulating film 39 and the pixel electrode 33 are covered by the bank 40. The bank 40 is also called a rib or a pixel separation film. The bank 40 is formed of an organic material such as, for example, acrylic resin. Openings 40a in each of which the pixel electrode 33 is exposed at the bottom are formed in the bank 40. The bank 40 lies on the peripheral region of the pixel electrode 33. An inner edge portion of the bank 40 that forms the opening 40a has a tapered shape that extends outward as it goes upward.

In a region where the pixel electrode 33 is not formed, an opening 32 may be provided in a portion of the inter-layer insulating film 39. The planarization film 20 and the bank 40 are in contact with each other through the opening 32. With this structure, moisture that is desorbed from within the planarization film 20 through a substrate heating step after forming the bank can be discharged to the outside through the bank 40. When the inter-layer insulating film 39 covers the entire surface of the planarization film 20, the moisture desorbed from within the planarization film 20 through the substrate heating step is gasified with no place to go.

Because of the internal pressure, therefore, interfacial peeling between the planarization film 20 and the inter-layer insulating film 39 or the crack of the inter-layer insulating film 39 occurs.

An organic film 50 is stacked on the bank 40 and the pixel electrode 33 exposed at the bottom of the opening 40a of the bank 40. The organic film 50 includes a hole transport layer 51, a light-emitting layer 53, and an electron transport layer 55 in this order from the bottom. The organic film 50 is not limited to this, and it is sufficient that the organic film 50 includes at least the light-emitting layer 53. Moreover, the organic film 50 may include a hole injection layer below the hole transport layer 51 or include an electron injection layer on the electron transport layer 55.

The light-emitting layer 53 is formed inside and around each of the plurality of openings 40a formed in the bank 40. The light-emitting layers 53 are individually formed, separate from each other. The light-emitting layers 53 emit light of multiple colors including, for example, red, green, and blue respectively corresponding to the plurality of unit pixels.

The light-emitting layers 53 are individually formed by evaporation using a mask. The layers of the organic film 50 other than the light-emitting layer 53 are each formed by evaporation as a uniform film (so-called solid film) that extends across the plurality of unit pixels and spreads over the entire display region. The layers are not limited to this, and may be formed by evaporation using a mask for changing the film thickness for each color. Also the light-emitting layer 53 may be formed by evaporation as a solid film, in which case the light-emitting layer 53 emits light of a single color (e.g., white), and the components of the respective multiple colors including, for example, red, green, and blue are extracted by color filters or color conversion layers. The formation of the layers of the organic film 50 is not limited to evaporation, and the layers may be formed by application.

The organic film 50 is covered by a Mg-containing film (metal-containing film) 60. The Mg-containing film 60 is formed as, for example, a uniform film (so-called solid film) that extends across the plurality of unit pixels and spreads over the entire display region. At least the lower portion of the Mg-containing film 60 has conductivity. The lower portion having conductivity functions as a counter electrode (e.g., a cathode). The Mg-containing film 60 will be described in detail later.

The organic film 50, and the pixel electrode 33 and the Mg-containing film 60 interposing the organic film 50 therebetween constitute an organic EL element. The light-emitting layer 53 of the organic film 50 emits light with a current flowing between the pixel electrode 33 and the Mg-containing film 60. This organic EL element is of a top emission type, and the light from the light-emitting layer 53 transmits through the Mg-containing film 60 and is extracted to the upper side. Moreover, the Mg-containing film 60 functions as a half-mirror, and forms a resonator structure that amplifies light at a specific wavelength between the pixel electrode 33 and the Mg-containing film 60. In the case of forming the resonator structure described above, the film thickness of the organic film 50 in each of the unit pixels may be varied according to wavelengths.

A thin crystal layer made of an alkali metal or an alkaline earth metal, such as calcium (Ca), sodium (Na), or cesium (Cs), may be formed between the organic film 50 and the Mg-containing film 60.

The Mg-containing film 60 is covered and thus sealed by the sealing film (passivation film) 70, and therefore is shielded from moisture. The sealing film 70 has a three-layer stacked structure including, for example, an inorganic film 71, an organic film 72, and an inorganic film 73 in this order from the bottom. The inorganic films 71 and 73 are formed of an inorganic insulating material such as, for example, silicon oxide ($SiO_2$), silicon nitride (SiN), or silicon oxynitride (SiON). A material containing at least nitrogen is preferably selected for the inorganic film 71 in contact with the Mg-containing film 60. The organic film 72 is formed of an organic insulating material such as, for example, acrylic resin, and planarizes the upper surface of the sealing film 70.

The second substrate 14 (see FIG. 1) is provided on the sealing film 70. The second substrate 14 may include a touch panel substrate, or function also as a cover glass. The sealing film 70 and the second substrate 14 are bonded together by an adhesive material using, for example, resin or the like.

Figure 3:
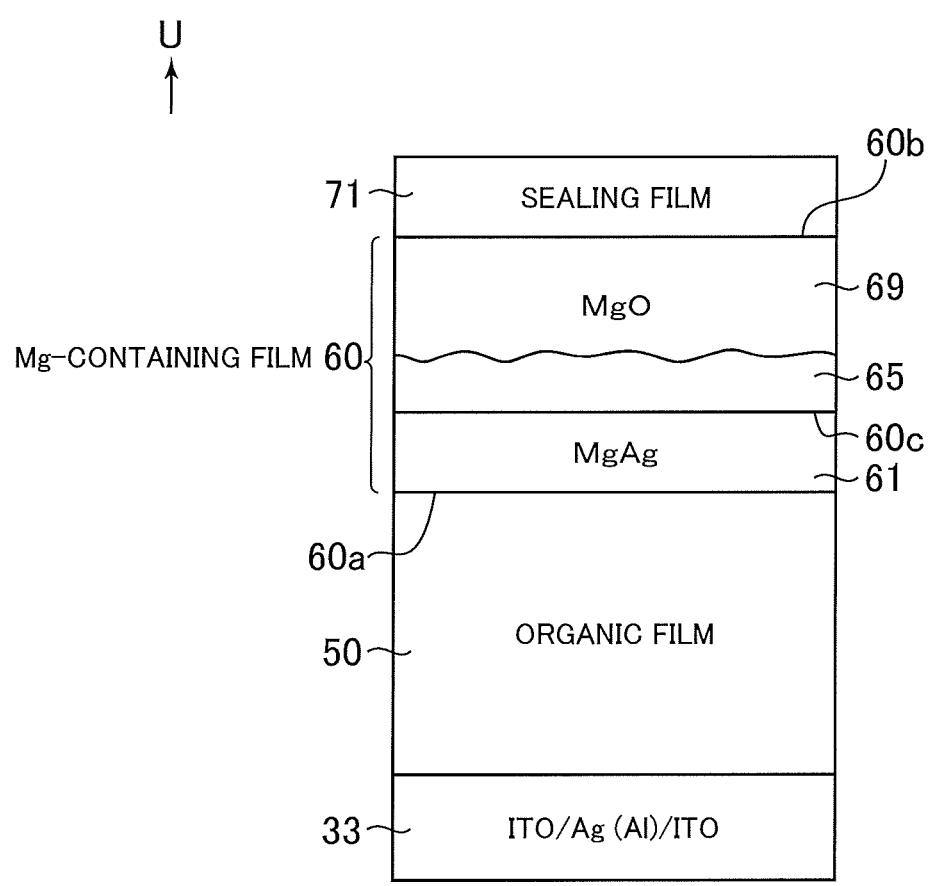
FIG. 3 is a diagram showing a basic configuration example of a Mg-containing film (metal-containing film).

FIG. 3 is a diagram showing a basic configuration example of the Mg-containing film (metal-containing film) 60. The Mg-containing film 60 contains magnesium (Mg) across the entire region in the up-and-down direction. The Mg-containing film 60 is continuously deposited from a lower interface 60a to an upper interface 60b, as will be described later, and therefore is an integrated film.

The Mg-containing film 60 includes a conductive metal layer 61 forming the lower interface 60a. The conductive metal layer 61 functions, on the organic film 50, as a counter electrode (cathode) and also functions as a half-mirror. The conductive metal layer 61 is formed of, for example, a magnesium-silver alloy (MgAg).

Moreover, the Mg-containing film 60 includes a light-transmitting oxide layer 69 forming the upper interface 60b. The light-transmitting oxide layer 69 has a light-transmitting property, and thus light from the organic film 50 transmits through the light-transmitting oxide layer 69. The light-transmitting oxide layer 69 is formed of, for example, magnesium oxide (MgO). Magnesium oxide (MgO) is transparent in a visible light region.

Moreover, the Mg-containing film 60 may include an intermediate layer 65 between the conductive metal layer 61 and the light-transmitting oxide layer 69. The intermediate layer 65 contains magnesium. The silver content of the intermediate layer 65 is lower than that of the conductive metal layer 61, and the oxygen content of the intermediate layer 65 is lower than that of the light-transmitting oxide layer 69. A specific configuration example of the intermediate layer 65 will be described later.

In the Mg-containing film 60, the conductive metal layer 61 forming the lower interface 60a functions as a half-mirror while the film thickness of the conductive metal layer 61 is formed to be thin to such an extent that the conductive metal layer 61 transmits light. With this configuration, the entire Mg-containing film 60 including the conductive metal layer 61, the intermediate layer 65, and the light-transmitting oxide layer 69 has a light-transmitting property.

A barrier property against water, oxygen, or the like can be ensured by forming the light-transmitting oxide layer 69 above the conductive metal layer 61 in the Mg-containing film 60. With this configuration, the entry of water, oxygen, or the like into the conductive metal layer 61 or the organic film 50 can be suppressed, and thus the durability of the device can be improved. Especially the magnesium oxide (MgO) contained in the light-transmitting oxide layer 69 has a moisture-absorbing property, and therefore, moisture entering from the outside is trapped by the light-transmitting oxide layer 69 and does not reach the organic film 50. Moreover, the light-transmitting oxide layer 69 has a light-transmitting property, and therefore, the durability of the device can be improved without blocking the light transmitting through the Mg-containing film 60 and extracted to the upper side.

In order for the conductive metal layer 61 to fulfill the functions of acting as a cathode and a mirror, the thickness of the conductive metal layer 61 is preferably, for example, 5 nm or more, and more preferably 10 nm or more. On the other hand, the transmission of light is blocked if the conductive metal layer 61 is too thick, and therefore, the thickness of the conductive metal layer 61 is preferably, for example, 30 nm or less, and more preferably 25 nm or less.

The Mg-containing film 60 includes the light-transmitting oxide layer 69 in addition to the conductive metal layer 61, and thus is formed to be thicker than an electrode (e.g., approximately 5 to 30 nm) made of a metal thin film, which is made thin for ensuring a transmittance in the related art. With this configuration, the barrier property against water, oxygen, or the like is ensured. For ensuring the barrier property against water, oxygen, or the like, the thickness of the Mg-containing film 60 is preferably, for example, 100 nm or more, and more preferably 150 nm or more. On the other hand, the effect of the barrier property is saturated if the Mg-containing film 60 is too thick; therefore, the thickness of the Mg-containing film 60 is preferably, for example, 300 nm or less, and more preferably 250 nm or less.

FIGS. 4A to 4D are diagrams showing Steps 1 to 4 of a manufacturing method of the display device according to an embodiment of the invention. In Step 1, the conductive metal layer 61 made of MgAg is deposited on the organic film 50. Specifically, MgAg is formed by co-evaporation of Mg and Ag. That is, Mg evaporating from a Mg source is supplied, and Ag evaporating from an Ag source is supplied, so that MgAg is deposited on the organic film 50. Generally, in an evaporation step, a form is employed in which an evaporation material is caused to evaporate, while being disposed on the lower side, to be deposited on a surface that is disposed facing downward on the upper side; however, to simplify the correspondence with the up-and-down relationship in the stacking direction, expressions are unified such that the deposition direction is upward.

In Step 2, a Mg simple-substance layer 67 made of a simple substance of Mg is deposited on the conductive metal layer 61 formed in Step 1. The deposition of the Mg simple-substance layer 67 may be performed continuously with the deposition of the conductive metal layer 61. In this case, the deposition of the Mg simple-substance layer 67 is continuously performed by changing the ratio of Ag to Mg in the deposition of the conductive metal layer 61. Specifically, the conductive metal layer 61 and the Mg simple-substance layer 67 are continuously formed by switching a state where Mg and Ag are co-evaporated to a state where the supply of Mg continues and the supply of Ag is stopped. The stop of supply of Ag is realized by, for example, disposing a cover on the Ag source or stopping the heating of the Ag source.

Through Step 2, a Mg-containing film 60P (before an oxidation treatment) including the conductive metal layer 61 forming the lower interface 60a and the Mg simple-substance layer 67 forming the upper interface 60b is formed. The Mg-containing film 60P is continuously deposited, and therefore is an integrated film. Moreover, an intermediate interface 60c is formed between the conductive metal layer 61 and the Mg simple-substance layer 67 of the Mg-containing film 60P.

In Step 3, the upper interface 60b of the Mg-containing film 60P formed in Step 2 is oxidized. Specifically, an oxygen plasma treatment is applied to the upper interface 60b of the Mg-containing film 60P, that is, the upper surface of the Mg simple-substance layer 67. Alternatively, annealing may be performed in an oxygen atmosphere. In Step 3 shown in FIG. 4C, the case where the oxidation proceeding from the upper interface 60b does not exceed the intermediate interface 60c is shown.

Through Step 3, the light-transmitting oxide layer 69 made of MgO is formed in the upper portion of the Mg-containing film 60P, and a first example (hereinafter referred to as "Mg-containing film 60A") of the Mg-containing film 60 is completed. The Mg-containing film 60A includes the conductive metal layer 61 forming the lower interface 60a and the light-transmitting oxide layer 69 forming the upper interface 60b, and further includes, as the intermediate layer 65, a Mg simple-substance layer 68 made of a simple substance of Mg between the conductive metal layer 61 and the light-transmitting oxide layer 69. The Mg simple-substance layer 68 is a remaining unoxidized portion of the Mg simple-substance layer 67 (see FIG. 4B) included in the Mg-containing film 60P before the oxidation treatment.

In the Mg-containing film 60A, a difference in Ag concentration is relatively large between portions on and below the intermediate interface 60c formed between the conductive metal layer 61 and the Mg simple-substance layer 68, and the intermediate interface 60c is likely to reflect the light from the organic film 50, which is therefore optically advantageous in that also the intermediate interface 60c contributes to the resonator structure.

In Step 4, the inorganic film 71, which is the lowermost layer of the sealing film 70, is deposited on the Mg-containing film 60A formed in Step 3. The inorganic film 71 is made of an inorganic insulating material such as, for example, silicon oxide ($SiO_2$), silicon nitride (SiN), or silicon oxynitride (SiON). The inorganic film 71 is formed by, for example, chemical vapor deposition (CVD). Thereafter, the organic film 72 and the inorganic film 73 are formed on the inorganic film 71 to complete the sealing film 70.

Figure 4A:
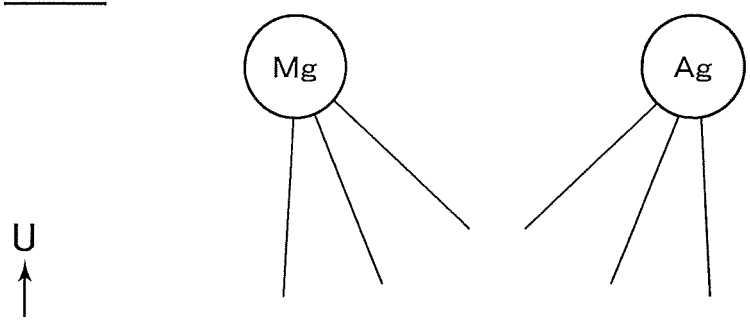
FIG. 4A is a diagram showing Step 1 of a manufacturing method of the display device according to an embodiment of the invention.
Figure 4A:
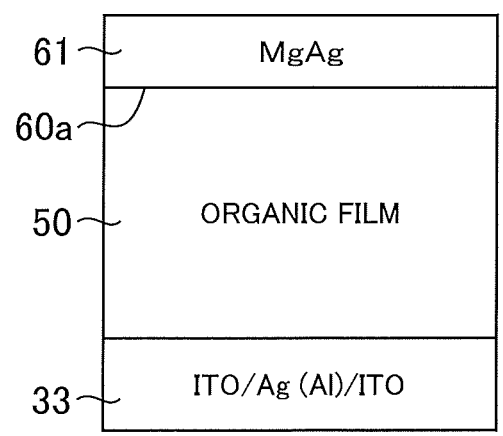
Figure 4B:
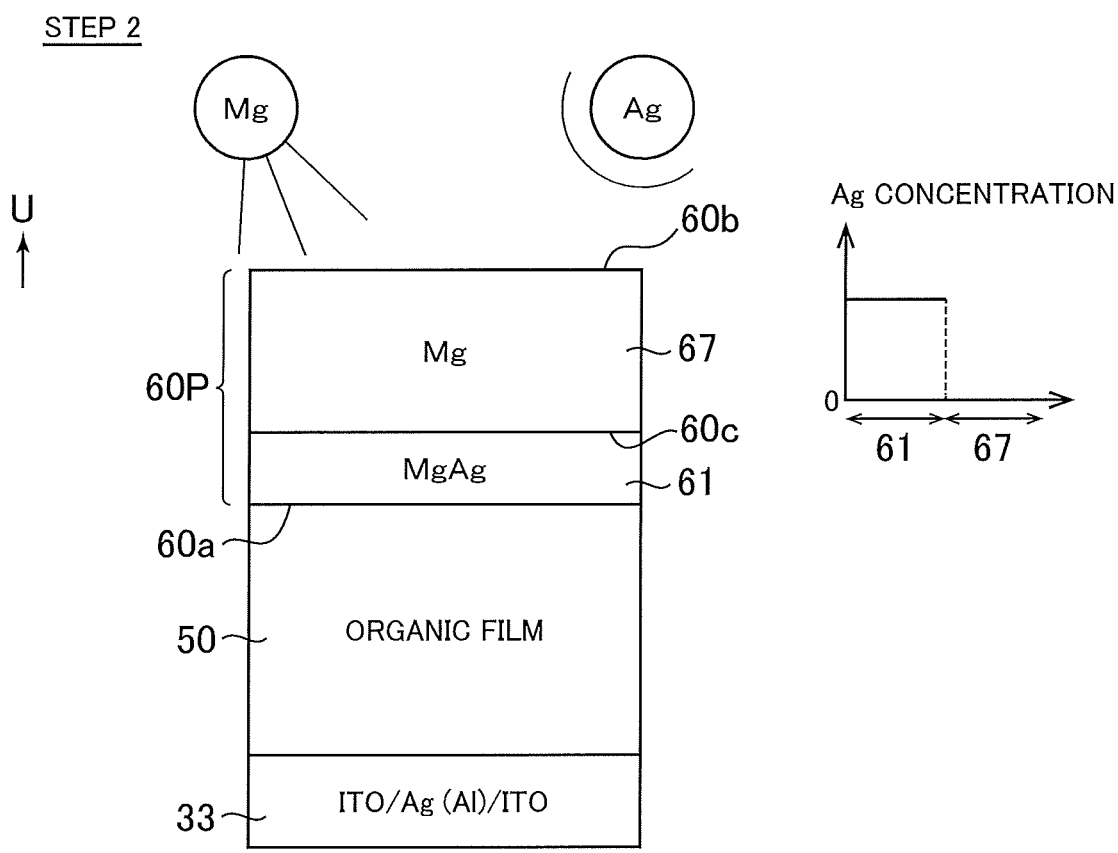
FIG. 4B is a diagram showing Step 2 subsequent to Step 1.
Figure 4C:
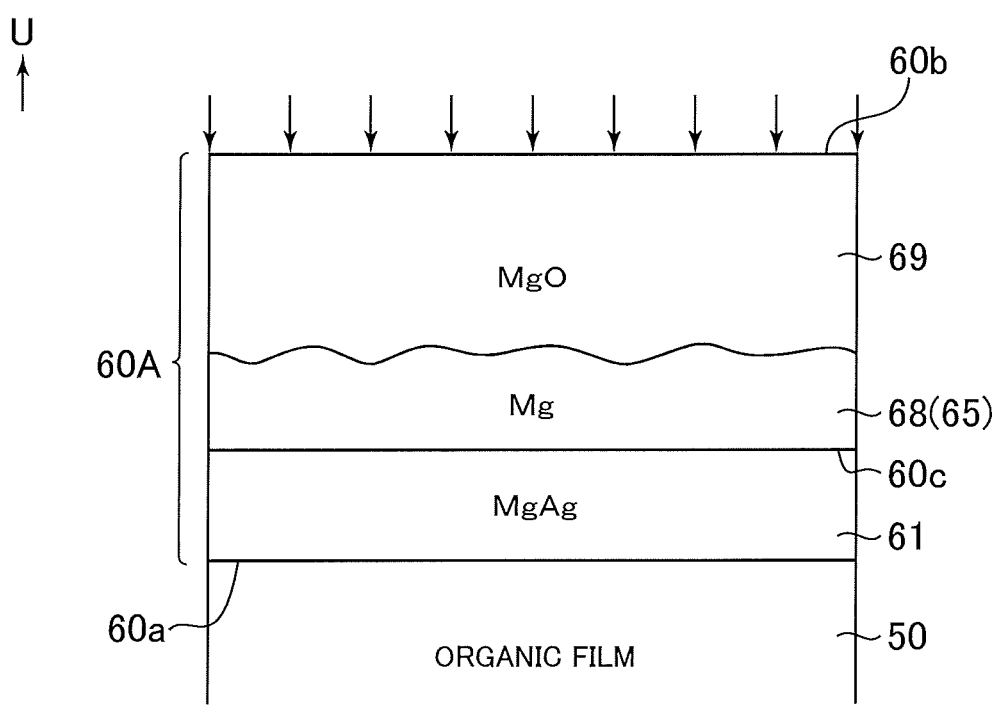
FIG. 4C is a diagram showing Step 3 subsequent to Step 2.
Figure 4D:
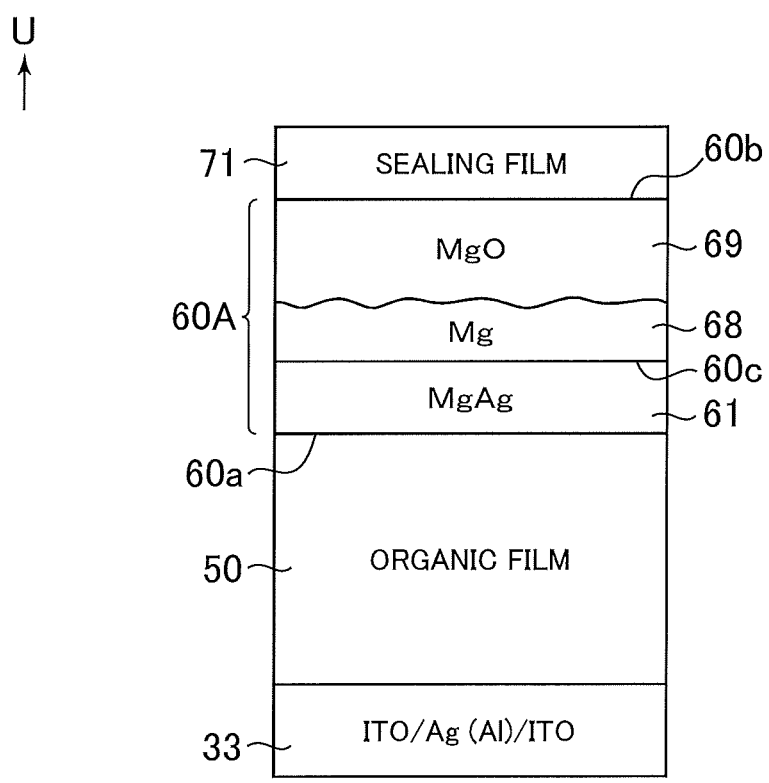
FIG. 4D is a diagram showing Step 4 subsequent to Step 3.
Figure 5:
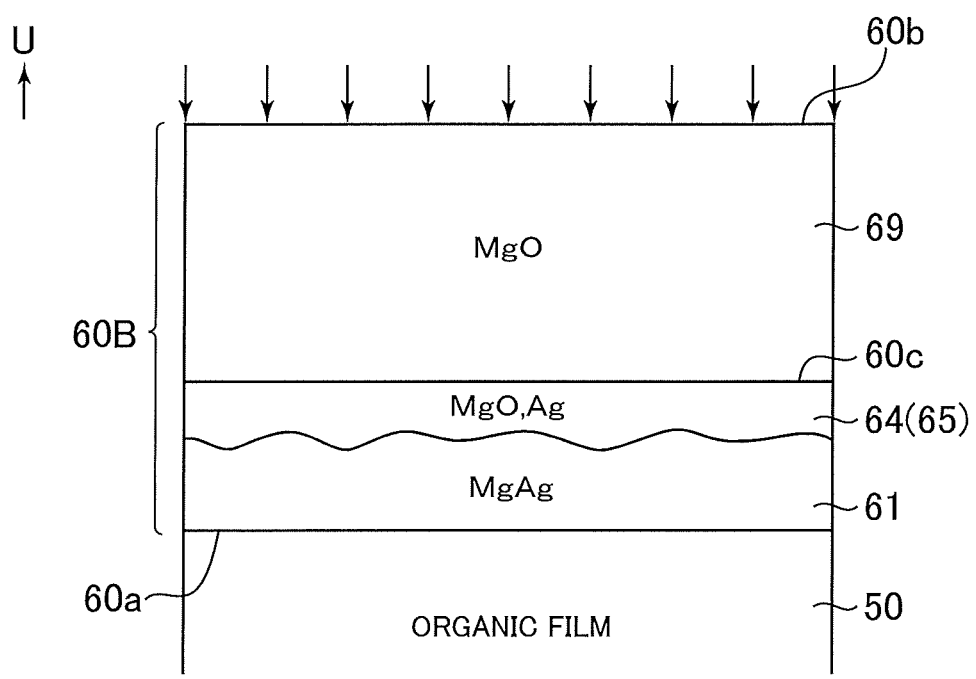
FIG. 5 is a diagram showing a modified example of the Mg-containing film.

FIG. 5 is a diagram showing a modified example (hereinafter referred to as "Step 3B") of Step 3 in FIG. 4C. In Step 3B, the case where the oxidation proceeding from the upper interface 60b exceeds the intermediate interface 60c is shown. The progress of oxidation changes in response to, for example, the energy of oxygen plasma in the oxygen plasma treatment.

Through Step 3B, a second example (hereinafter referred to as "Mg-containing film 60B") of the Mg-containing film 60 is completed. The Mg-containing film 60B includes the conductive metal layer 61 forming the lower interface 60a and the light-transmitting oxide layer 69 forming the upper interface 60b, and further includes, as the intermediate layer 65, a mixed layer 64 containing MgO and Ag between the conductive metal layer 61 and the light-transmitting oxide layer 69. The mixed layer 64 is a layer that is formed by oxidation of the upper portion of the conductive metal layer 61 included in the Mg-containing film 60P (see FIG. 4B) before the oxidation treatment. In the mixed layer 64, MgO and Ag that are separated by oxidation of MgAg are mixed together.

Figure 6A:
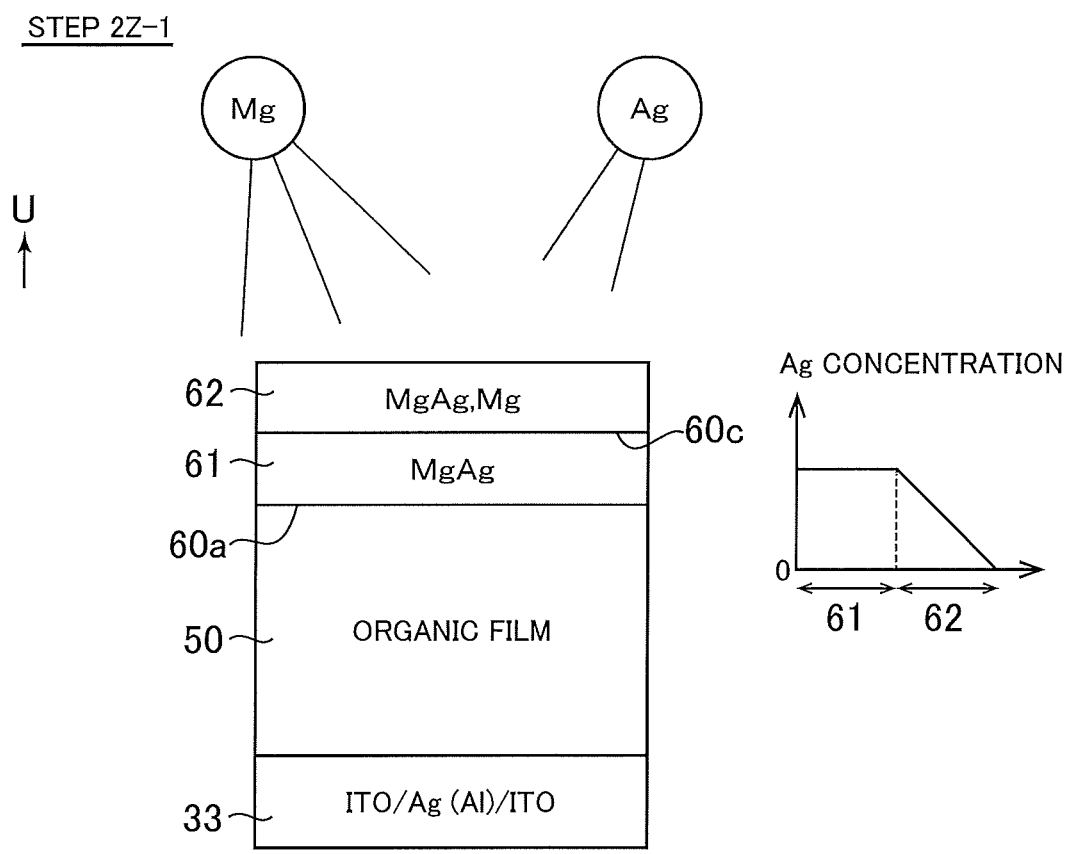
FIG. 6A is a diagram showing a modified example of Step 2.
Figure 6B:
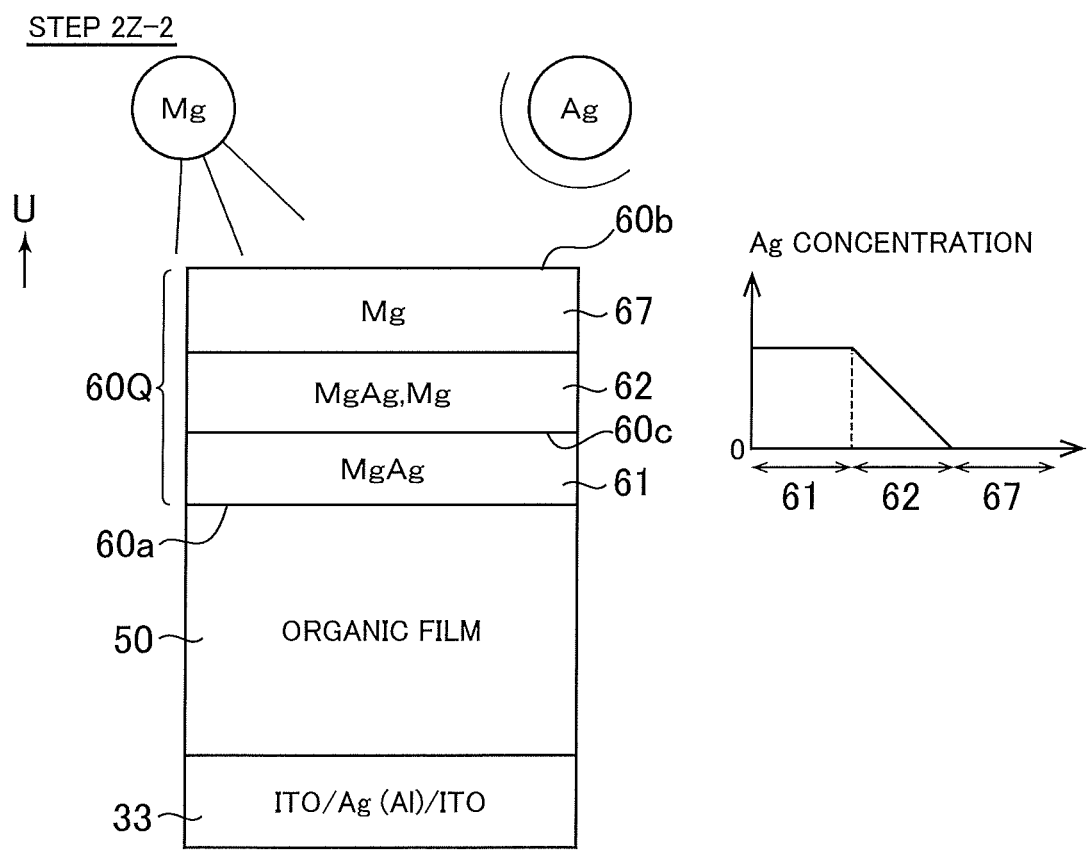
FIG. 6B is a diagram showing a modified example of Step 2.

FIGS. 6A and 6B are diagrams showing a modified example (hereinafter referred to as "Steps 2Z-1 and 2Z-2") of Step 2 in FIG. 4B.

First, in Step 2Z-1, a mixed layer 62 in which an Ag concentration is gradually reduced toward the upper side is deposited on the conductive metal layer 61 formed in Step 1. In the mixed layer 62, MgAg and Mg are mixed together. The deposition of the mixed layer 62 is performed continuously with the deposition of the conductive metal layer 61. Specifically, the conductive metal layer 61 and the mixed layer 62 are continuously formed by switching the state where Mg and Ag are co-evaporated to a state where the supply of Mg continues and the supply of Ag is gradually reduced. The gradual reduction in the supply of Ag is realized by, for example, gradually reducing the temperature of the Ag source.

In subsequent Step 2Z-2, the Mg simple-substance layer 67 made of a simple substance of Mg is deposited on the mixed layer 62 formed in Step 2Z-1. The deposition of the Mg simple-substance layer 67 is performed continuously with the deposition of the mixed layer 62. Specifically, the mixed layer 62 and the Mg simple-substance layer 67 are continuously formed by switching the state where the supply of Mg continues and the supply of Ag is gradually reduced to a state where the supply of Mg continues and the supply of Ag is stopped. The stop of supply of Ag is realized by, for example, disposing a cover on the Ag source or stopping the heating of the Ag source.

Through Steps 2Z-1 and 2Z-2, a Mg-containing film 60Q (before an oxidation treatment) including the conductive metal layer 61 forming the lower interface 60a, the Mg simple-substance layer 67 forming the upper interface 60b, and the mixed layer 62 between the conductive metal layer 61 and the Mg simple-substance layer 67 is formed. The Mg-containing film 60Q is continuously deposited, and therefore is an integrated film. According to this configuration, the mixed layer 62 in which the Ag concentration is gradually reduced is included, so that the Mg-containing film 60Q can be deposited stably and easily.

Figure 7:
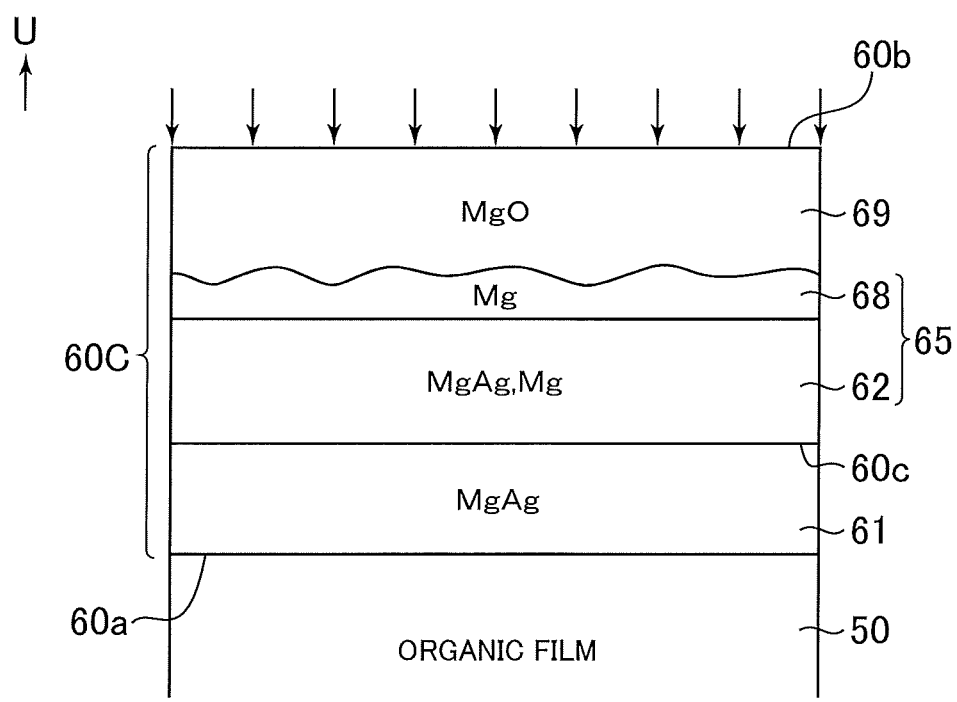
FIG. 7 is a diagram showing a modified example of the Mg-containing film.

FIG. 7 is a diagram showing another modified example (hereinafter referred to as "Step 3C") of Step 3 in FIG. 4C. In Step 3C, the upper interface 60b of the Mg-containing film 60Q formed in Step 2Z-2 is oxidized. In Step 3C, the case where the oxidation proceeding from the upper interface 60b does not exceed the interface between the Mg simple-substance layer 67 and the mixed layer 62 is shown.

Through Step 3C, a third example (hereinafter referred to as "Mg-containing film 60C") of the Mg-containing film 60 is completed. The Mg-containing film 60C includes the conductive metal layer 61 forming the lower interface 60a and the light-transmitting oxide layer 69 forming the upper interface 60b, and further includes, as the intermediate layer 65, the mixed layer 62 containing MgAg and Mg and the Mg simple-substance layer 68 made of a simple substance of Mg between the conductive metal layer 61 and the light-transmitting oxide layer 69. The Mg simple-substance layer 68 is a remaining unoxidized portion of the Mg simple-substance layer 67 (see FIG. 6B) included in the Mg-containing film 60Q before the oxidation treatment.

Figure 8:
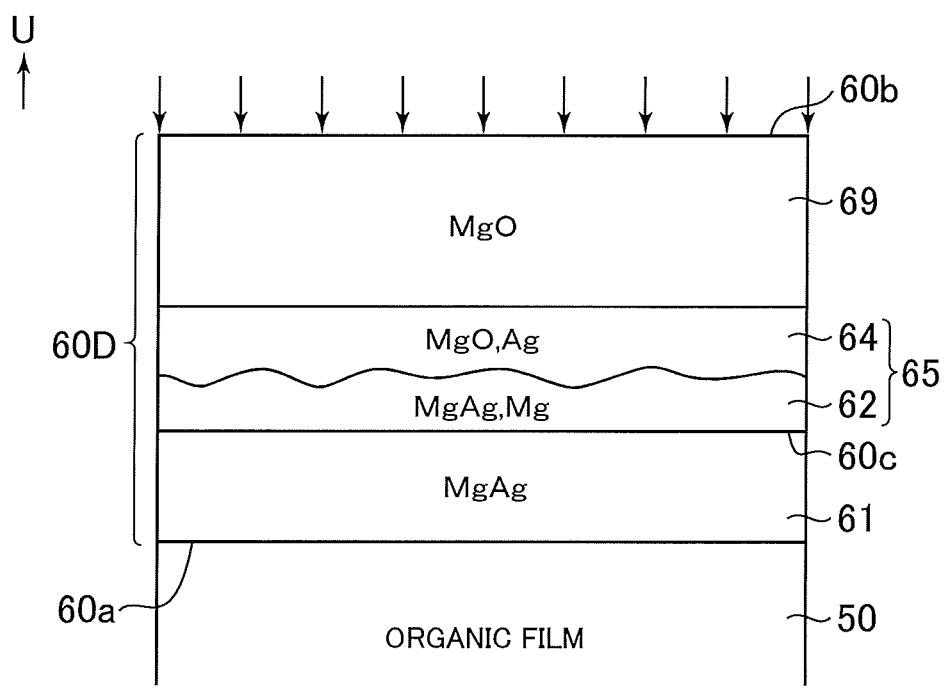
FIG. 8 is a diagram showing a modified example of the Mg-containing film.

FIG. 8 is a diagram showing still another modified example (hereinafter referred to as "Step 3D") of Step 3 in FIG. 4C. In Step 3D, the upper interface 60b of the Mg-containing film 60Q formed in Step 2Z-2 is oxidized. In Step 3D, the case where the oxidation proceeding from the upper interface 60b exceeds the interface between the Mg simple-substance layer 67 and the mixed layer 62 but does not exceed the interface between the mixed layer 62 and the conductive metal layer 61 is shown.

Through Step 3D, a fourth example (hereinafter referred to as "Mg-containing film 60D") of the Mg-containing film 60 is completed. The Mg-containing film 60D includes the conductive metal layer 61 forming the lower interface 60a and the light-transmitting oxide layer 69 forming the upper interface 60b, and further includes, as the intermediate layer 65, the mixed layer 62 containing MgAg and Mg and the mixed layer 64 containing MgO and Ag between the conductive metal layer 61 and the light-transmitting oxide layer 69. The mixed layer 64 is a layer that is formed by oxidation of the upper portion of the mixed layer 62 included in the Mg-containing film 60Q (see FIG. 6B) before the oxidation treatment and containing MgAg and Mg.

Figure 9:
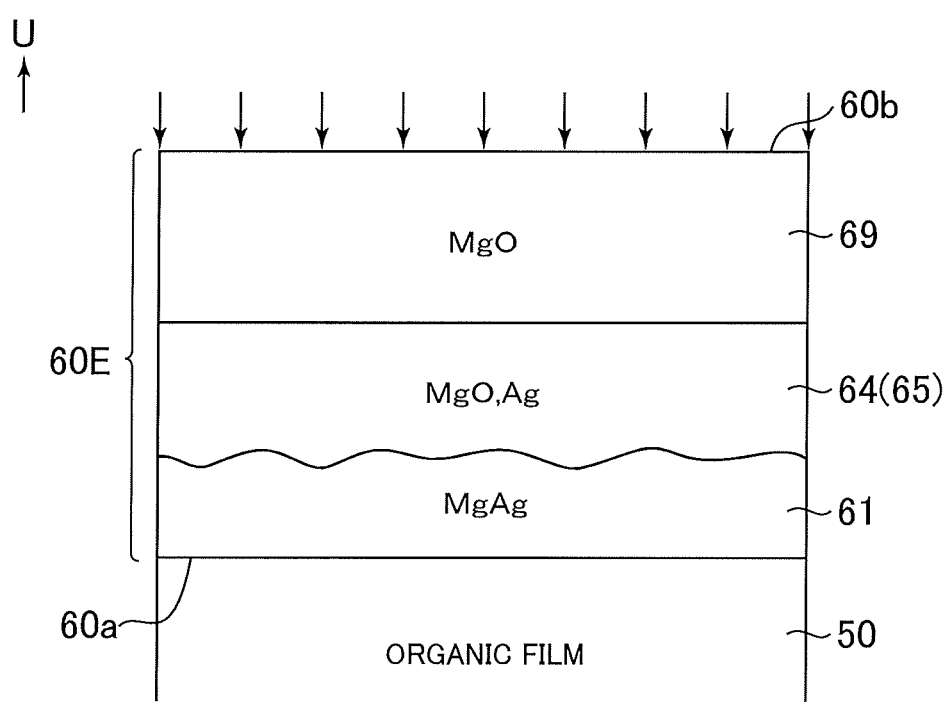
FIG. 9 is a diagram showing a modified example of the Mg-containing film.

FIG. 9 is a diagram showing still another modified example (hereinafter referred to as "Step 3E") of Step 3 in FIG. 4C. In Step 3E, the upper interface 60b of the Mg-containing film 60Q formed in Step 2Z-2 is oxidized. In Step 3E, the case where the oxidation proceeding from the upper interface 60b exceeds the interface between the Mg simple-substance layer 67 and the mixed layer 62 and exceeds the interface between the mixed layer 62 and the conductive metal layer 61 is shown.

Through Step 3E, a fifth example (hereinafter referred to as "Mg-containing film 60E") of the Mg-containing film 60 is completed. The Mg-containing film 60E includes the conductive metal layer 61 forming the lower interface 60a and the light-transmitting oxide layer 69 forming the upper interface 60b, and further includes, as the intermediate layer 65, the mixed layer 64 containing MgO and Ag between the conductive metal layer 61 and the light-transmitting oxide layer 69. The mixed layer 64 is a layer that is formed by oxidation of the entire mixed layer 62 included in the Mg-containing film 60Q (see FIG. 6B) before the oxidation treatment and containing MgAg and Mg, and oxidation of the upper portion of the conductive metal layer 61.

Although an example in which magnesium (Mg) is applied as a first metallic element has been described in the embodiments described above, the invention is not limited to this. Any metallic element that has conductivity in the form of a simple substance or an alloy of the metallic element and another metallic element and has a light-transmitting property in the form of an oxide can be applied as the first metallic element. For example, aluminum (Al) may be applied as the first metallic element. In this case, the metal-containing film may include a conductive metal layer 61 forming the lower interface 60a, formed of a simple substance of aluminum (Al), and having conductivity, and a light-transmitting oxide layer 69 forming the upper interface 60b, formed of aluminum oxide ($Al_2O_3$), and has a light-transmitting property.

In the embodiment, an organic EL display device has been exemplified as an example of the disclosure. However, other application example include all types of flat panel display devices such as a liquid crystal display device and other self-emitting display devices, or an electronic paper display device including an electrophoretic element. Moreover, it is needless to say that the invention can be applied, without particular limitations, to small and medium to large display devices.

Various variations and modifications are conceivable by those skilled in the art within the idea of the invention, and it will be understood that all such variations and modifications also fall within the scope of the invention. For example, those skilled in the art can appropriately modify the embodiments described above by addition, deletion, or design change of components, or by addition, omission, or condition change of steps, and all such modifications also fall within the scope of the invention as long as they contain the gist of the invention.

What is claimed is:
1. A display device comprising:
an electrode;
a light-emitting layer formed on the electrode; and a Mg-containing film formed on the light-emitting layer and containing magnesium (Mg), wherein
the Mg-containing film includes
a first metal layer forming an interface of the Mg-containing film on the side of the light-emitting layer and formed of a magnesium-silver alloy (MgAg),
a second metal layer on the first metal layer, formed of magnesium (Mg),
a third metal layer between the first metal layer and the second metal layer, the third metal layer formed of a magnesium-silver alloy (MgAg), and
a light-transmitting oxide layer on the second metal layer, the light transmitting oxide layer forming an interface of the Mg-containing film on the opposite side from the interface on the side of the light-emitting layer and formed of magnesium oxide (MgO), wherein
a concentration of magnesium (Mg) in the third metal layer is higher than a concentration of magnesium (Mg) in the first metal layer.

2. The display device according to claim 1, further comprising a sealing film formed on the Mg-containing film and formed of an inorganic insulating material.

3. The display device according to claim 1, wherein
a concentration of silver (Ag) in the first metal layer is higher than a concentration of silver (Ag) in the third metal layer.

4. The display device according to claim 1, wherein
a concentration of silver (Ag) continuously changes between the first metal layer and the third metal layer.

5. A manufacturing method of a display device, comprising:
forming, on a light-emitting layer, a Mg-containing film containing magnesium (Mg), the Mg-containing film including a metal layer forming an interface of the Mg-containing film on the side of the light-emitting layer and formed of a magnesium-silver alloy (MgAg), and a Mg simple-substance layer forming an interface of the Mg-containing film on the opposite side from the interface on the side of the light-emitting layer and formed of magnesium (Mg); and
oxidizing a part of the Mg simple-substance layer and remaining another part of the Mg simple-substance layer, wherein
the another part of the Mg simple-substance layer is between the magnesium-silver alloy (MgAg) and oxidized Mg (MgO).

6. The manufacturing method of a display device according to claim 5, wherein
the forming of the Mg-containing film includes forming the metal layer by supplying magnesium (Mg) and silver (Ag), and thereafter forming the Mg simple-substance layer by continuing the supply of magnesium (MG) and stopping the supply of silver (Ag).

7. The manufacturing method of a display device according to claim 6, wherein
the forming of the Mg simple-substance layer includes continuing the supply of magnesium (Mg), and gradually reducing and then stopping the supply of silver (Ag).

8. The manufacturing method of a display device according to claim 5, wherein
the oxidizing of the interface of the Mg-containing film on the opposite side includes applying an oxygen plasma treatment to the interface of the Mg-containing film on the opposite side.

9. The manufacturing method of a display device according to claim 5, further comprising,
after oxidizing the interface of the Mg-containing film on the opposite side, forming, on the Mg-containing film, a sealing film formed of an inorganic insulating material.

10. The manufacturing method of a display device according to claim 5, wherein
in the Mg-containing film, a concentration of silver (Ag) on the side of the interface with the metal layer is higher than a concentration of silver (Ag) on the side of the interface with the Mg simple-substance layer.

11. The manufacturing method of a display device according to claim 5, wherein
in the Mg-containing film, a concentration of silver (Ag) continuously changes between the side of the interface with the metal layer and the side of the interface with the Mg simple-substance layer.

* * * * *